(12) United States Patent
Dudek et al.

(10) Patent No.: US 7,064,385 B2
(45) Date of Patent: Jun. 20, 2006

(54) DMOS-TRANSISTOR WITH LATERAL DOPANT GRADIENT IN DRIFT REGION AND METHOD OF PRODUCING THE SAME

(75) Inventors: Volker Dudek, Brackenheim (DE); Michael Graf, Leonberg (DE)

(73) Assignee: Atmel Germany GmbH, Heilbronn (DE)

( * ) Notice: Subject to any disclaimer, the term of this patent is extended or adjusted under 35 U.S.C. 154(b) by 82 days.

(21) Appl. No.: 10/946,547

(22) Filed: Sep. 20, 2004

(65) Prior Publication Data

US 2005/0062102 A1  Mar. 24, 2005

(30) Foreign Application Priority Data

Sep. 19, 2003  (DE)  .................. 103 45 347

(51) Int. Cl.
*H01L 29/76*  (2006.01)
(52) U.S. Cl. ................. 257/335; 257/343; 257/655
(58) Field of Classification Search ............. 257/335, 257/336, 343, 347, 655, 657; 438/197
See application file for complete search history.

(56) References Cited

U.S. PATENT DOCUMENTS

| | | | |
|---|---|---|---|
| 4,523,369 A | 6/1985 | Nagakubo | |
| H204 H | 2/1987 | Oh et al. | |
| 4,682,405 A | 7/1987 | Blanchard et al. | |
| 4,756,793 A | 7/1988 | Peek | |
| 4,808,543 A | 2/1989 | Parrillo et al. | |
| 4,893,160 A | 1/1990 | Blanchard | |
| 4,975,384 A | 12/1990 | Baglee | |
| 5,317,432 A | 5/1994 | Ino | |
| 5,338,965 A | 8/1994 | Malhi | |
| 5,387,534 A | 2/1995 | Prall | |
| 5,406,111 A | 4/1995 | Sun | |
| 5,434,435 A | 7/1995 | Baliga | |
| 5,466,616 A | 11/1995 | Yang | |
| 5,482,873 A | 1/1996 | Yang | |
| 5,539,238 A | 7/1996 | Malhi | |
| 5,569,949 A | 10/1996 | Malhi | |
| 5,696,010 A | 12/1997 | Malhi | |
| 5,763,915 A | 6/1998 | Hshieh et al. | |
| 5,780,353 A | 7/1998 | Omid-Zohoor | |
| 5,844,275 A | 12/1998 | Kitamura et al. | |
| 5,846,866 A | 12/1998 | Huang et al. | |
| 5,869,875 A | 2/1999 | Hebert | |
| 5,874,346 A | 2/1999 | Fulford, Jr. et al. | |
| 5,882,966 A | 3/1999 | Jang | |
| 5,902,127 A | 5/1999 | Park | |
| 5,915,195 A | 6/1999 | Fulford, Jr. et al. | |
| 5,929,481 A | 7/1999 | Hshieh et al. | |

(Continued)

FOREIGN PATENT DOCUMENTS

DE    19733974    8/1998

(Continued)

*Primary Examiner*—Mark V. Prenty
(74) *Attorney, Agent, or Firm*—W. F. Fasse; W. G. Fasse

(57) ABSTRACT

A DMOS-transistor has a trench bordered by a drift region including two doped wall regions and a doped floor region extending along the walls and the floor of the trench. The laterally extending floor region has a dopant concentration gradient in the lateral direction. For example, the floor region includes at least two differently-doped floor portions successively in the lateral direction. This dopant gradient in the floor region is formed by carrying out at least one dopant implantation from above through the trench using at least one mask to expose a first area while covering a second area of the floor region.

30 Claims, 1 Drawing Sheet

U.S. PATENT DOCUMENTS

| | | | |
|---|---|---|---|
| 5,960,276 A | 9/1999 | Liaw et al. | |
| 6,001,678 A | 12/1999 | Takahashi | |
| 6,040,597 A | 3/2000 | Kim et al. | |
| 6,072,216 A | 6/2000 | Williams et al. | |
| 6,150,235 A | 11/2000 | Doong et al. | |
| 6,184,566 B1 | 2/2001 | Gardner et al. | |
| 6,187,651 B1 | 2/2001 | Oh | |
| 6,190,954 B1 | 2/2001 | Lee et al. | |
| 6,228,726 B1 | 5/2001 | Liaw | |
| 6,232,636 B1 * | 5/2001 | Simpson et al. | 257/347 |
| 6,242,788 B1 | 6/2001 | Mizuo | |
| 6,495,294 B1 | 12/2002 | Yamauchi et al. | |
| 6,518,127 B1 | 2/2003 | Hshieh et al. | |
| 6,613,651 B1 | 9/2003 | Puchner et al. | |
| 6,780,713 B1 | 8/2004 | Bromberger et al. | |
| 2003/0001202 A1 | 1/2003 | Kitamura | |
| 2003/0003638 A1 | 1/2003 | Bromberger et al. | |
| 2003/0003643 A1 | 1/2003 | Bromberger et al. | |
| 2003/0003669 A1 | 1/2003 | Bromberger et al. | |
| 2003/0122188 A1 | 7/2003 | Blanchard | |

FOREIGN PATENT DOCUMENTS

| | | |
|---|---|---|
| DE | 69316256 | 8/1998 |
| DE | 10131705 | 6/2001 |
| DE | 10220810 | 11/2002 |
| DE | 10131706 | 1/2003 |
| DE | 10131707 | 1/2003 |
| EP | 0176778 | 4/1986 |
| EP | 0209949 | 1/1987 |
| EP | 0232322 | 8/1987 |
| EP | 0547711 | 6/1993 |
| EP | 0562271 | 9/1993 |
| EP | 0837509 | 4/1998 |
| EP | 0905784 | 3/1999 |
| JP | 55130173 | 10/1980 |
| JP | 56040280 | 4/1981 |
| JP | 56050558 | 5/1981 |
| JP | 56062365 | 5/1981 |
| JP | 56085857 | 7/1981 |
| JP | 58204569 | 11/1983 |
| JP | 61161732 | 7/1986 |
| JP | 03082071 | 4/1991 |
| JP | 03084925 | 4/1991 |
| JP | 2000012842 | 1/2000 |

* cited by examiner

DMOS-TRANSISTOR WITH LATERAL DOPANT GRADIENT IN DRIFT REGION AND METHOD OF PRODUCING THE SAME

PRIORITY CLAIM

This application is based on and claims the priority under 35 U.S.C. §119 of German Patent Application 103 45 347.4, filed on Sep. 19, 2003, the entire disclosure of which is incorporated herein by reference.

FIELD OF THE INVENTION

The invention relates to a DMOS-transistor formed in a semiconductor body, with a trench-shaped drift region having a source-side wall region, a drain-side wall region, and a floor region extending in a lateral direction between the bottom ends of the wall regions. The invention further relates to a method of fabricating such a DMOS-transistor.

BACKGROUND INFORMATION

A DMOS-transistor and a fabrication method thereof in the above mentioned general field are known from the German Patent Laying-Open Publication DE 101 31 705 A1, as well as the counterpart U.S. Pat. No. 6,780,713 (Bromberger et al.), the entire disclosure of which is incorporated herein by reference.

In general, a DMOS-transistor is distinguished from a typical Metal Oxide Semiconductor (MOS) transistor in that the DMOS-transistor additionally has a drift region extending between an edge of a control gate and a drain region of the transistor. Such a drift region is a region in which the motion of the charge carriers is caused or effected only by an electric field prevailing between or across the respective opposite ends of the region. In a Lateral DMOS-transistor (LDMOS-transistor), the drift region extends in a lateral direction between the edge of the control gate and the drain region which is displaced from the control gate in the lateral direction.

DMOS-transistors are used as high voltage components in applications in which so-called drain voltages of more than 100 V can be applied between the drain region and the source region of the transistor.

It is known from U.S. Pat. No. 5,539,238 (Malhi) to produce a DMOS-transistor with a deep trench structure, wherein the drift region of the transistor is formed by doped regions adjoining the sidewalls and the floor of the trench. Because the drift region is formed or extends partially in a vertical direction along the sidewalls of the trench, the horizontal length or surface area of the transistor can be reduced. It is a disadvantage in such a conventional DMOS-transistor with a trench, however, that when a blocking or off-state voltage is applied, inhomogeneities of the potential curve or pattern arise at the corners of the trench structure, i.e. where the walls meet the floor, and these inhomogeneities lead to an undesired reduction of the blocking or off-state voltage. Moreover, the total length of the drift region is not reduced in such a conventional trenched DMOS transistor, but merely divided into two substantially vertical portions and one lateral portion. In other words, for this reason, the specific turn-on resistance Rsp=Rdson/area is not reduced, which would be desirable however. To the contrary, the sidewall regions can only be insufficiently doped, and the specific turn-on resistance Rsp and therewith the surface area or "real estate" or "footprint" consumed by the transistor are undesirably increased.

A further DMOS-transistor and a method of producing it are known from the European Patent Application Publication EP 0,837,509 A1. Therein, a self-adjusting drift region is formed under a LOCOS (LOCal Oxidation of Silicon) oxide in a DMOS-transistor. In the known fabrication process, it is disadvantageous that the doping of the drift region is introduced before the oxidation step, and the proportion of the dopant that diffuses into the oxide during the subsequent oxidation can only be inaccurately determined. Furthermore, the high temperature loading that results during the thermal oxidation step leads to a very broad or wide dopant distribution, which in turn causes an even greater inaccuracy of the dopant concentration. Furthermore, a rather large thickness of silicon is necessary below the oxide in order to increase the blocking or off-state voltage by means of the so-called (and per se known) "RESURF" (REduced SURface Field) effect. The field reduction in this context results from a reduced charge carrier concentration in the drift region. Finally, in general, due to process variances or tolerances in the fabrication process, rather large and undesirable variances arise in the electrical parameters of the fabricated transistors.

A primary goal of research and development in the field of DMOS-transistors is to further reduce the dimensions of structures, that exhibit or comprise low field strengths in connection with an applied blocking or off-state voltage, in order to avoid a generation of charge carriers that would lead to a breakdown within the component. A further goal in the development of DMOS-transistors is to achieve a low specific turn-on resistance Rsp. This is to reduce the surface area consumed by integrated circuits in which DMOS-transistors represent a substantial proportion of the total chip surface area.

SUMMARY OF THE INVENTION

In view of the above, it is an object of the invention to provide a DMOS-transistor structure and a fabrication method thereof, wherein the DMOS-transistor exhibits a high blocking or off-state voltage while requiring the smallest possible surface area. The invention further aims to avoid or overcome the disadvantages of the prior art, and to achieve additional advantages, as apparent from the present specification. The attainment of these objects is, however, not a required limitation of the claimed invention.

The above objects have been achieved in a DMOS-transistor structure and a fabrication method thereof, wherein the DMOS-transistor is embodied in a semiconductor body, with a drift region formed along or bounding a trench in the semiconductor body. The drift region includes a source-side region along a source-side wall of the trench, a drain-side region along a drain-side wall of the trench, and a floor region extending in a lateral direction along a floor of the trench between the bottom ends of the two sidewalls. Especially according to the invention, the floor region exhibits a dopant concentration gradient in the lateral direction. This is achieved by doping the floor region by at least one dopant implantation step from above and through the trench into the floor region, such that at least one dopant implantation affects or is applied to only a first portion but not a second portion of the floor region. In other words, by differentially implanting a dopant with different concentrations into at least two portions of the floor region, a dopant concentration gradient is established in the lateral direction in the floor region.

Previously, dopant profiles of the dopant concentration within the drift region of a conventional DMOS-transistor have been uniform and continuous in the lateral direction, as achieved by a uniform dopant implantation and/or drive process (e.g. thermal drive). Through such conventional processes and the resulting DMOS-transistor structures, the dopant profile can be exactly adjusted in a vertical direction, but a modification, variation, or gradient of the dopant concentration in a lateral direction cannot be achieved in the conventionally known manners. However, in order to increase the breakdown voltage and reduce the resistance it is better (according to the invention) to differentially dope the drift region in a lateral direction, and particularly to dope the drift region to a higher dopant concentration on the drain side and to a lower dopant concentration on the source side. Similarly, it can be advantageous if the middle portion of the drift region is doped to a higher concentration than the ends or edges. These features are achieved in the inventive transistor structure, and according to the inventive fabrication process.

A considerable advantage of the present invention is given by the further achievable optimization within a parameter field that is essentially determined by the specific turn-on resistance Rsp, the breakdown voltage Vbreak and the size and configuration of the Safe Operation Area (SOA). This further possibility of optimization results from the production of the lateral gradient of the dopant concentration in the floor region of the trench-shaped structure in the inventive DMOS-transistor. More particularly, this lateral gradient may be embodied in connection with different concentrations of the dopant in the source-side wall region relative to the drain-side wall region, whereby these wall regions together with the floor region form the drift region of the transistor. With these features, the invention can achieve a DMOS-transistor with a further reduced total surface area. Furthermore, the onset and the strength of the RESURF effect can be especially advantageously optimized by means of a dopant concentration with different magnitudes or a gradient along the floor of the trench-shaped structure.

An adaptation of the dopant profile along the floor of the trench to the electrical requirements is also especially advantageous, because a gradient of the dopant profile of the floor, due to the RESURF effect, at least in connection with the dopant profile in the source-side wall region, has a substantial influence on the breakdown voltage both in the blocking or off-state as well as the conducting or on-state, while the drain-side dopant profile has a significant influence on the turn-on resistance Rdson.

It is preferred that the floor region is doped to a higher concentration in a portion near the drain-side wall than in a portion near the source-side wall. Through this embodiment, a further reduced specific turn-on resistance Rsp can be achieved.

Alternatively, it is preferred that a central portion of the floor region is doped to a higher concentration than end portions of the floor region near the drain-side wall and/or near the source-side wall, because such a dopant concentration gradient tends to increase the blocking or off-state voltage.

In the inventive fabrication process, it is further preferred that a complementary second portion of the floor region is covered or blocked by a mask before carrying out the implantation of a dopant from above into a first portion of the floor region. Preferably in this regard, a self-adjusting mask process step is utilized for masking the second portion of the floor region. According to a further preferred feature of the inventive process, the mask is formed by a structure or pattern transfer by means of lithography and etching. It is also preferred that a positive or a negative of the mask can be defined by a photoresist layer. Through these features of the invention, the dopant concentration gradients can be produced in the floor region utilizing current mask technologies with a reproducible high accuracy. Moreover, such current mask steps can be integrated without problems into typical DMOS fabrication processes.

It is further preferred that the special process steps for forming the dopant concentration gradient in the floor region according to the invention are carried out after a step of forming an opening in a hard mask for defining the drift region. At this time in the overall device fabrication process, the required process steps for forming the floor region dopant concentration gradient can be integrated into otherwise typical or conventional fabrication processes without modifying preceding or subsequent process steps.

According to another preferred feature of the invention, the trench-shaped structure or trench is formed in a semiconductor body having a first well region of a first conductivity type and a second well region of a second conductivity type. Particularly, the trench is formed partially or completely within the second well region, i.e. partially or completely surrounded and enclosed by the remainder of the second well region. The further the second well region extends in the direction toward the source, the stronger is the reduction of the specific turn-on resistance Rsp, because the floor region of the trench and the second well both have the same polarity or conductivity type of the dopant. Simultaneously, the resulting transistor exhibits a high breakdown voltage, because the concentrations of the respective doping of the first and second well regions are significantly lower than the dopant concentrations of the source and drain regions. Moreover, both well regions can be fabricated in a self-adjusting manner in a single mask step through a LOCOS (LOCal Oxidation of Silicon) oxidation process including an etch and an oxidation. In this regard it is advantageous to drive or penetrate the first well region deeper and longer into the semiconductor body, in order to form a lateral PN-junction between the two well regions below the trench so as to thereby generate a RESURF effect, which serves to increase the breakdown voltage.

Another preferred feature of the invention is to provide a spacing between the drain-side wall of the trench and the drain-region itself, whereby this spacing preferably lies in a range from 0.5 µm to 4.0 µm. Investigations carried out by the applicant have shown that a desirable symmetry can be achieved in the range of the breakdown of the transistor if the spacing between the drain-side wall of the trench and the drain region falls within this range. Thereby, a local superelevation or excessive increase of the current density is suppressed, with the additional drain-side resistance, through the arising voltage drop. Especially in connection with a transverse or cross regulator, advantageous ESD protection structures can be produced with such transistors.

In a further preferred embodiment, the sidewall regions and the floor region of the trench are doped to a higher concentration value than the dopant concentration in the first well region. This achieves an increased RESURF effect and therewith an increase of the blocking or off-state voltage with a simultaneous reduction of the specific turn-on resistance Rsp. On the other hand, providing the same dopant concentration in the source-side wall region and in the drain-side wall region of the trench structure simplifies the introduction of the dopant and increases the specific turn-on resistance Rsp only slightly, because the individual concentrations of the dopants in the respective regions are summed or added, insofar as the drain region begins directly at the sidewall of the trench structure, i.e. overlaps with the drain-side wall region, and the penetration depth of the drain-side doping lies in the range of the depth of the trench-shaped structure.

It is further preferred that the trench has an aspect ratio, i.e. the ratio of the trench width to the trench depth, greater than 0.5 and preferably greater than 1.0, while the width of the trench is in a range from 0.5 μm to 4.0 μm. Investigations carried out by the applicant with regard to various different dopant concentrations for the wall regions and the floor region have shown that it is advantageous if the aspect ratio of the trench and the absolute value of the trench width respectively fall within these specified ranges.

It is still further preferred that the trench is a tapering trench, that tapers toward the bottom, i.e. so that the floor region has a smaller width in the lateral direction than the lateral opening width at the top of the trench, i.e. at the top surface of the semiconductor body. Through this configuration of the trench, excessive increases or peaks of the field strength at the corners of the trench where the sidewalls meet the floor can be suppressed.

It is further preferred that the trench is formed by means of an STI (Shallow Trench Isolation) etching, and is filled with an insulating material, preferably an insulating oxide. Because the doping is carried out with a low implantation energy only after the silicon etching, and thereafter the process does not involve forming a thick LOCOS oxide with a high temperature loading, it is possible to form spatially highly doped regions in a small vertical distance below the floor of the trench, whereby these highly doped regions represent a buried conductive path with a low resistance. Moreover, the surface area consumed by the transistor is reduced, because the process variations or tolerances of the dopant profile introduced into the trench structure are reduced through the self-adjusting nature of the process steps as described herein, in connection with a simultaneous reduction of the temperature loading in comparison to a LOCOS oxidation process.

Alternatively, it is preferred that the trench structure is formed or generated using or in connection with a LOCOS oxidation process. In this case, the open trench is formed by means of a tapered or V-trench etching step and is thereafter filled with an oxide through a LOCOS oxidation step, which is preferably carried out by means of a high pressure oxidation due to the lower temperature loading. The doping of the sidewalls and of the floor of the trench is carried out before the LOCOS oxidation, whereby the introduced doses of the dopants are increased by the amount or proportion of the dopants that will diffuse into the oxide during the oxidation step, i.e. to compensate for the diffusion loss of the dopant.

It is also preferred that the semiconductor body comprises an insulating intermediate layer below a surface layer consisting of a semiconducting substrate. The DMOS-transistor structure is formed or produced in the surface layer consisting of the semiconducting substrate. According to a further preferred detail, the thickness of the surface layer (consisting of the semiconducting substrate) extending below the trench structure lies in a range between one-half and a factor of five times the depth of the trench structure.

Preferably, the inventive process for forming the dopant concentration gradient in the lateral direction in the floor region at the bottom of the trench is carried out within a method for the fabrication of a DMOS-transistor in a semiconductor body that comprises a surface layer consisting of a semiconducting substrate with a source region, a drain region of a second conductivity type, a first well region of a first conductivity type enclosing the source region, and a second well region of the second conductivity type enclosing the drain region, as well as a gate region formed on the surface of the surface layer of the semiconductor body, wherein this gate region extends beginning from the source region entirely over the lateral extent of the first well region in this direction. Furthermore, a trench structure is formed penetrating from the surface of the semiconductor body into the surface layer consisting of the semiconducting substrate. A doping of the second conductivity type is produced with a first dopant concentration value in the floor region along the floor of the trench structure, a doping of the second conductivity type with a second dopant concentration value is produced in the source-side wall region along the source-side wall of the trench structure, and a doping of the second conductivity type with a third dopant concentration value is produced in the drain-side wall region along the drain-side wall of the trench structure. The first and/or second and/or third dopant concentration values are preferably different from one another, while some of the values (e.g. the second and third values) can be the same.

Investigations by the applicant have shown that DMOS-transistors according to the invention and produced according to the inventive method, and especially according to the last above mentioned preferred embodiments, are especially suitable for the fabrication of high voltage blocking or off-state integrated circuits that comprise an output driver for powering or activating and controlling inductive loads. This is especially true for DMOS-transistors that have been fabricated from a silicon wafer with an insulating intermediate layer, i.e. a so-called Silicon On Insulator (SOI) wafer.

Further advantageous embodiments and features of the invention are disclosed in the remainder of the specification and the accompanying drawings. It should be understood that the features of the invention disclosed herein cannot only be used in the expressly described combinations, but rather can be used in other combinations or individually while still being within the scope of the present invention.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
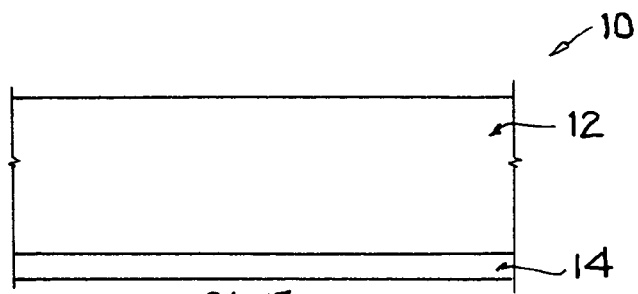
FIG. 1 is a schematic side view of a portion of an SOI wafer that is used as the starting basis for an example of the inventive method for fabricating an inventive DMOS-transistor.

FIG. 1 shows a portion of a semiconductor body 10 that comprises a semiconducting substrate 12 on an insulating intermediate layer 14. A typical example of such a semiconductor body 10 is represented by a "Silicon On Insulator" (SOI) wafer. In that context, the insulating intermediate layer 14 is typically realized as a silicon dioxide layer.

For producing a DMOS-transistor in the semiconductor body 10, a first step of the process involves forming a (e.g. P-doped) first well region 16 and a (e.g. N-doped) second well region 18 by introducing suitable dopants into the silicon semiconductor body 10. The two well regions 16 and 18 are doped so as to establish respective opposite conductivity types therein. For example, to achieve a P-conductivity, the first well region 16 is doped with acceptors (forming trivalent substitution defects, for example boron atoms). On the other hand, the second well region 18, in order to produce an N-conductivity, is doped with donors (forming pentavalent substitution defects such as arsenic or phosphorus).

Figure 2:
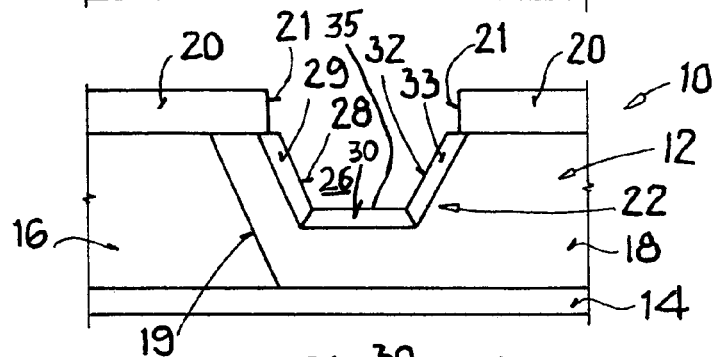
FIG. 2 schematically shows the SOI wafer of FIG. 1 in a subsequent step during the inventive process, after the semiconductor body has been doped for wall regions and a trench has been formed.

The respective areas of the first and second well regions 16 and 18 are lithographically defined with masks in a photoresist layer to form respective corresponding windows therein. Then, a wet-chemical etching step opens or etches away an oxide in the resist windows down to the silicon surface. After the free or exposed silicon surface has been covered with an oxide (e.g. a scattering oxide, a deposited oxide, or an in situ grown oxide), then a doping is carried out by means of ion implantation. After the dopant implantation, a thermal curing and activating procedure (a thermal drive step) is carried out, wherein the dopant atoms are deeply diffused into the silicon semiconductor body and are activated. More particularly, in the example of an SOI wafer as the semiconductor body 10, the dopant atoms are driven into the silicon substrate 12 all the way down to the insulating oxide layer 14 by the diffusion process. In this regard it is advantageous to drive the first well region 16 longer, so as to form a lateral PN-junction 19 below the location of the trench structure to be formed later, because such a PN-junction 19 strengthens or enhances the RESURF effect and thus desirably increases the breakdown voltage. FIG. 2 shows such a sloping PN-junction 19, of which, however, the laterally extending slope component is only relatively weak or minimal. By driving the first well region 16 laterally further under the second well region 18, the lateral extent of the PN-junction 19 can be increased or enhanced (see FIG. 4).

In a further process step, a hard mask 20 is provided, for example consisting of a nitride and/or an oxide, and an opening 21 is etched therein. Once again, the etching window for forming the opening 21 is defined by a photoresist mask applied thereon, for example in any conventionally known manner. Next, a dopant (donor) is implanted through the opening 21 and is then driven into the semiconductor body 10 by a thermal curing and activating step (thermal drive) achieving a diffusion of the dopant into the semiconductor body 10 so as to form a doped region 22 below the opening 21 of the hard mask 20.

In order to achieve different dopant concentrations in lateral edge portions of the doped region 22, the implantation of the dopant atoms can be carried out at a tilt angle, for example 60°, so that the dopant atoms or ions are implanted differentially, i.e. with a different concentration, in different areas, for example due to the shadowing or masking effect of the hard mask 20. In a subsequent process step, the doped region 22 is hollowed out to a certain extent. Namely, a trench structure 26 is formed within the doped region 22, for example by an anisotropic Shallow Trench Isolation (STI) etching. In such STI etching technology, an anisotropic etching process forms a trench between areas covered with a nitride protective layer, and the resulting trench is later filled with an insulating material such as silicon dioxide or polysilicon. In this context, a trench having an aspect ratio, i.e. a ratio of trench depth to trench width, smaller than 1 is regarded as "shallow" in the sense of Shallow Trench Isolation. In other words, a shallow trench is wider than it is deep.

The trench 26 is bounded by a source-side wall 28, a drain-side wall 32, and a floor 35 extending laterally between the bottom ends of the two walls 28 and 32. The walls 28 and 32 preferably slope so that the trench 26 tapers downwardly toward the floor 35. Since the trench 26 has been formed within, and removed only a portion of, the doped region 22, portions of the doped region 22 remain to respectively form a source-side wall region 29 along the source-side wall 28, a drain-side wall region 33 along the drain-side wall 32, and a floor region 30 along the floor 35.

After forming the trench structure 26, further steps may be carried out for defining or achieving the desired dopant concentration profile in the wall regions 29 and 33 and the floor region 30. For example, additional implantation doping of the wall regions 29 and 33 and (especially) of the floor region 30 may be carried out after the trench 26 has been formed. In order to achieve a high precision of the desired dopant concentration in the final resulting floor region 30, it is advantageous to first establish a defined dopant starting value or condition and thereafter produce a lateral dopant concentration gradient in the floor region 30. For this purpose, the STI etching may be continued downwardly into the semiconductor body 10 to such a depth that any possible remaining dopant of the doped region 22 is completely removed before defining the floor region 30. In other words; the trench 26 is etched to a greater depth than the depth to which the dopant was introduced into the region 22. Thus, the dopant introduced before the trench etching step merely defines the dopant concentration in the wall regions 29 and 33 along the sidewalls 28 and 32, but does not influence the dopant concentration in the floor region 30.

Then, in order to dope the floor region 30 in a defined manner without substantially changing the doping of the sidewall regions 29 and 33, a protective layer is first formed on the sidewalls 28 and 32 by coating the sidewalls with a thin scattering oxide. Through the oxidation step, the dopant remaining from the first, i.e. earlier, implantation step is simultaneously diffused into deeper regions or areas from the regions along the sidewalls 28 and 32. In this regard, the first source-side wall region 29 ends up having a first dopant concentration, while the second drain-side wall region 33 ends up having a second dopant concentration. The first dopant concentration especially deviates from the second dopant concentration if the implantation took place at a tilt angle, for example such that an implantation in a direction toward the drain-side wall region 33 was preferentially carried out in comparison to the implantation into the opposite source-side wall region 29.

The inventive method further provides special steps for achieving a dopant concentration gradient in the lateral direction in the floor region 30 extending along and lying under the surface of the floor 35 at the bottom of the trench 26. The special method steps in this regard will now be described with reference to FIG. 3.

For this purpose, first a photoresist mask 34 is provided to only partially cover the floor region 30, i.e. only partially cover or mask off the trench floor 35. Then, a defined dopant quantity or dose is implanted in a vertical direction 42, laterally limited along the edge of the photoresist mask 34, downwardly into the exposed portion of the floor 35 of the trench 26. Thereby, the result is a source-side portion 38 and a drain-side portion 40 of the floor region 30, whereby these floor portions 38 and 40 have different dopant concentrations and complement one another to form the total floor region 30.

The additional mask step using the photoresist mask 34 is coupled to, follows, and is carried out in connection with the opening 21 of the hard mask 20 for the previous basic definition of the drift region bounding the trench 26. Namely, the hard mask 20 with the opening 21 remains in position and can guide or assist in the masking step using the photoresist mask 34. In the case of a LOCOS process, an area or portion of the drift region can be additionally implanted with a dopant, still before the LOCOS oxidation step, using an implantation mask. In the case of the STI process, an area or portion of the drift region may be additionally implanted with a dopant either before or after the floor implantation of the drift region. In both of these cases, thus, a portion of the drift region is covered with a mask, while the remaining uncovered portion is additionally doped with a dopant. Through the further process, the drain region is then formed to the right and the source region is then formed to the left of the trench 26, as will be described further below.

Figure 3:
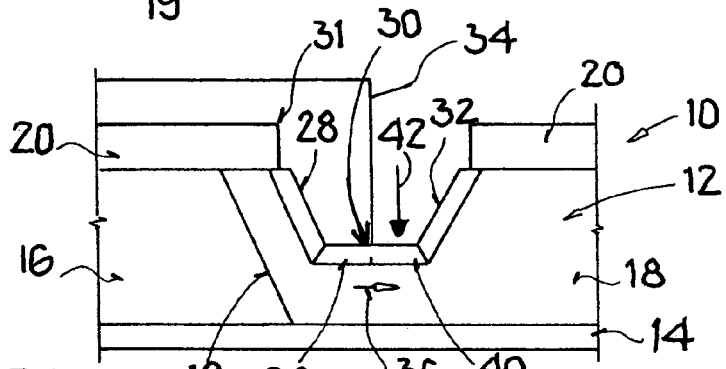
FIG. 3 schematically shows the SOI wafer in a further subsequent process step following that of FIG. 2, and particularly a masking step for producing a dopant concentration gradient in the lateral direction in the floor of a drift region.

With the arrangement as shown in FIG. 3, with a single photoresist mask 34 in a single position, the inventive process results in a dopant concentration gradient with respect to the transverse direction 36 in the floor region 30, which comprises the initially covered or masked floor portion 38 and the initially not-covered or not-masked floor portion 40. Due to the implantation being localized or limited by the mask 34, the floor portion 40 has a higher dopant concentration than the floor portion 38 (which may have a zero concentration of the implanted dopant), so that the dopant concentration gradient is oriented toward a higher concentration to the right as shown by the arrow 36 in FIG. 3. It should further be understood that an increasing dopant concentration in the opposite direction, i.e. anti-parallel or opposite the arrow 36, can easily be achieved simply by reversing the side on which the mask 34 is provided.

Moreover, the invention is not limited to a single transition of dopant concentration, i.e. two differently-doped floor portions 38 and 40, but rather can provide a greater number of differently-doped floor portions. Namely, by successively carrying out additional dopant implantation steps, respectively with successive different masks that successively expose larger (or smaller) areas of the trench floor 35, it is possible to achieve essentially any number of differently-doped floor portions, with essentially as fine a step-width as desired, in the lateral direction, in the floor region 30. Alternatively, instead of using successive different masks, it is possible to use the same mask 34, but to shift the mask 34 laterally in successive steps to carry out the successive dopant implantation steps.

In the above context, it is advantageous if one side of the opening lies or is positioned in a self-adjusting manner on one edge 31 of the underlying hard mask 20. Moreover, it is not absolutely necessary that the mask 34 must consist of a photoresist, but rather it can be made of other materials suitable for the purpose.

As a further alternative, it is possible to produce a dopant concentration gradient that is not monotonous in one direction, but rather increases and then decreases again, or decreases and then increases again. For example, it is possible to produce a central floor portion of the floor region 30 having a higher dopant concentration in comparison to lateral side or edge portions respectively between the central portion and the sidewalls 28 and 32. In other words, instead of providing an additional or increased doping on the drain side of the floor region 30, it is alternatively possible to provide an additional and thus higher doping of a middle portion of the floor region 30 of the drift region. This can be achieved using two masks or one mask with a properly located opening, so as to cover the two edge portions of the floor, for example.

Figure 4:
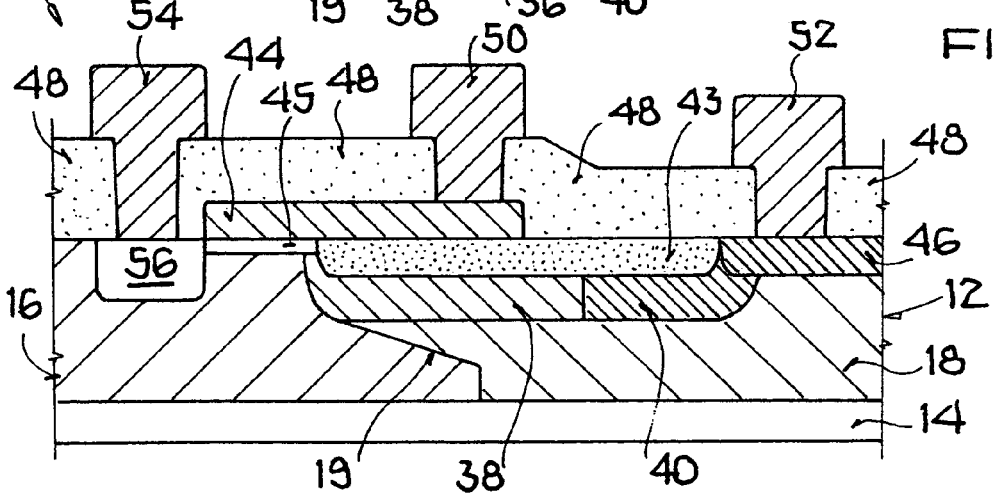
FIG. 4 is a schematic cross-section of the resulting dopant layers or regions and structures of the DMOS-transistor produced according to the invention.

The inventive structure as described in connection with FIGS. 1 to 3 above is further processed by additional processing steps, which may be any conventionally known processing steps, to produce a finished DMOS-transistor as shown in FIG. 4. For example, first the trench 26, which has remained open until this point, is filled with an insulating material, for example with a CVD oxide 43 deposited by Chemical Vapor Deposition (CVD). Furthermore, the surface of the filled trench 26 can be planarized through a Chemical Mechanical Polishing (CMP) step. Preferably, the filling of the trench 26 forming the drift region 29, 30, 33 is carried out simultaneously with filling further trenches provided in the semiconductor body 10 for insulating or isolating neighboring devices or components or elements from each other, i.e. for forming individual isolated component boxes through trench isolation in the semiconductor body 10.

Through further semiconductor device fabrication process steps, a gate region 44 (with an associated gate oxide 45), a drain region 46, and a source region 56 are formed or defined, and then covered with a passivating oxide layer 48 and electrically connected to a conductor path system (not shown) by metallic contacts 50, 52 and 54 by means of a contact window process. Moreover, as mentioned above, through the use of an SOI wafer with trench isolation, it is possible to fabricate a plurality of such DMOS-transistors on the single wafer or semiconductor body 10, whereby the individual fabricated transistors are respectively located in component boxes that are individually isolated from one another by the isolating trenches.

The drain region 46 is preferably defined so that it directly adjoins or extends entirely to the drain-side wall 32 of the trench structure 26. As a result, the dopant concentrations in this overlapping region of the drain-side wall region 33 and the drain region 46 are summed or added to each other. The source region 56 is preferably defined so that it is entirely enclosed or surrounded by the P-doped first well region 16, which in turn extends to and directly adjoins, in the lateral direction, the N-doped second well region 18 while forming a PN-junction 19 therebetween.

The slope direction of the sectional hatching in FIG. 4 respectively represents the polarity of the doping. Particularly, areas or regions having a negative polarity are sectionally hatched with lines extending from the top left toward the bottom right, while areas or regions having a positive polarity are sectionally hatched with lines extending from the bottom left to the top right. It should be understood that the respective polarities of the regions according to the invention are not limited to the example shown in FIG. 4, but rather the respective polarities could be reversed for example. Furthermore, the relative magnitude of the concentration of the dopant in each respective region or area is represented by the density or closeness of the sectional hatching lines. In other words, regions with a denser or closer arrangement of the sectional hatching lines have a relatively higher dopant concentration.

With the above description it can be seen that the invention has provided a process sequence for the fabrication of a DMOS-transistor, generally based on and including a conventional device fabrication process sequence, and further including special process steps according to the invention for achieving a desired lateral dopant concentration profile or gradient in a drift region, and especially in a floor region of the drift region, by means of one or more dopant implantations carried out from above through the trench. With such process steps and sequences, it is possible to fabricate both N- and P-DMOS-transistors for an integrated circuit.

The inventive method can also be used for fabricating DMOS-transistors in bulk substrates. Preferably, however, the DMOS-transistor is formed or produced in the surface layer consisting of a semiconducting substrate of a wafer further having an insulating intermediate layer. In that regard, it is advantageous if the thickness of the surface layer remaining under or below the trench structure 26, i.e. the remaining amount of the semiconducting substrate 12 between the trench floor 35 and the insulating intermediate layer 14, is between one-half and a factor of five times the depth of the trench 26 itself. It is further advantageous that the two well regions 16 and 18 directly adjoin the insulating intermediate layer 14, in order to suppress or reduce the parasitic capacitances. It is a further advantage that the required layer thickness of the semiconducting substrate 12 lies in the range of only a few nanometers, because the formation of a highly doped buried channel adjoining the floor of the trench structure has only a relatively small vertical extent or dimension.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A DMOS-transistor in a semiconductor body comprising:
   a trench in said semiconductor body bounded by a source-side wall, a drain-side wall, and a floor extending in a lateral direction between bottom ends of said walls; and
   a drift region including a doped source-side wall region in said semiconductor body along said source-side wall, a doped drain-side wall region in said semiconductor body along said drain-side wall, and a doped floor region in said semiconductor body extending in said lateral direction along said floor;
   wherein said floor region exhibits a dopant concentration gradient, in said lateral direction, of an implanted dopant that is implanted into said floor region to establish a higher dopant concentration in a first floor portion of said floor region and a lower dopant concentration in a second floor portion of said floor region.

2. The DMOS-transistor according to claim 1, wherein said implanted dopant is not implanted into said second floor portion so that said lower dopant concentration is a zero concentration of said implanted dopant.

3. The DMOS-transistor according to claim 1, wherein said first floor portion with said higher dopant concentration is proximate to said drain-side wall, and said second floor portion with said lower dopant concentration is proximate to said source-side wall.

4. The DMOS-transistor according to claim 1, wherein said floor region further has a third floor portion with a dopant concentration of said implanted dopant that is lower than said higher dopant concentration of said first floor portion, said first floor portion is between said second and third floor portions in said lateral direction, said second floor portion is proximate to said source-side wall, and said third floor portion is proximate to said drain-side wall.

5. The DMOS-transistor according to claim 1, wherein said first floor portion and said second floor portion laterally adjoin one another and together make up all of said floor region, which does not include further differently-doped portions.

6. The DMOS-transistor according to claim 1, wherein said floor region further includes at least one additional floor portion in addition to said first and second floor portions, said at least one additional floor portion respectively has a respective dopant concentration of said implanted dopant different from said dopant concentrations of said implanted dopant in others of said floor portions, and said floor portions are contiguous with one another in succession in said lateral direction.

7. The DMOS-transistor according to claim 1, wherein said source-side wall region, said floor region, and said drain-side wall region extend continuously and successively without gaps therebetween along all of said source-side wall, said floor, and said drain-side wall respectively, to form a continuous drift length of said drift region.

8. The DMOS-transistor according to claim 1, wherein said semiconductor body further comprises a first well region of a first conductivity type and a second well region of a second conductivity type, and wherein said trench and said drift region are at least partially within said second well region.

9. The DMOS-transistor according to claim 8, wherein said trench and said drift region are located entirely within and completely surrounded by said second well region.

10. The DMOS-transistor according to claim 8, wherein said floor region has said second conductivity type.

11. The DMOS-transistor according to claim 8, wherein said wall regions and said floor region have respective total dopant concentrations higher than a total dopant concentration of said second well region.

12. The DMOS-transistor according to claim 8, wherein said wall regions and said floor region have respective total dopant concentrations higher than a total dopant concentration of said first well region.

13. The DMOS-transistor according to claim 8, wherein a PN-junction is formed at an interface between said first and second well regions, and said PN-junction laterally extends below said floor region in a direction having at least a component in said lateral direction.

14. The DMOS-transistor according to claim 1, wherein said semiconductor body further comprises a drain region spaced apart from said drain-side wall by a spacing distance in a range from 0.5 µm to 4.0 µm.

15. The DMOS-transistor according to claim 1, wherein said trench has a width in a range from 0.5 µm to 4.0 µm and an aspect ratio greater than 0.5.

16. The DMOS-transistor according to claim 1, wherein said trench is a shallow trench having a width greater than a depth thereof.

17. The DMOS-transistor according to claim 1, wherein said trench is a tapering trench having a width at said floor smaller than a width at a surface of said semiconductor body.

18. The DMOS-transistor according to claim 1, wherein said semiconductor body comprises an insulating intermediate layer and a surface layer consisting of a semiconducting substrate disposed on said insulating intermediate layer, and wherein said DMOS-transistor is formed in and/or on said surface layer.

19. The DMOS-transistor according to claim 18, wherein a remaining thickness of said surface layer between said floor of said trench and said insulating intermediate layer is from one half to five times a depth of said trench.

20. A DMOS-transistor in a semiconductor body comprising:
   a trench in said semiconductor body bounded by a source-side wall, a drain-side wall, and a floor extending in a lateral direction between bottom ends of said walls; and
   a drift region including a doped source-side wall region in said semiconductor body along said source-side wall, a doped drain-side wall region in said semiconductor body along said drain-side wall, and a doped floor region in said semiconductor body extending in said lateral direction along said floor;
   wherein said floor region exhibits a dopant concentration gradient, in said lateral direction, of an implanted dopant that is implanted into said floor region to establish a higher dopant concentration in a first floor portion of said floor region and a lower dopant concentration in a second floor portion of said floor region;
   wherein said semiconductor body comprises an insulating intermediate layer and a surface layer consisting of a semiconducting substrate disposed on said insulating intermediate layer, and wherein said DMOS-transistor is formed in and/or on said surface layer;
   further comprising, in said surface layer, a first well region of a first conductivity type, a second well region of a second conductivity type, a source region disposed within and surrounded by said first well region, a drain region of the second conductivity type disposed within and surrounded by said second well region;
   further comprising a gate region disposed on a surface of said surface layer of said semiconductor body, wherein said gate region, beginning from said source region, extends laterally over at least a portion of said trench over an entire lateral extension of said first well region; and
   wherein said floor region has a first concentration value of a total dopant concentration of a dopant of the second conductivity type therein, said source-side wall region has a second concentration value of a total dopant concentration of a dopant of the second conductivity type therein, and said drain-side wall region has a third concentration value of a total dopant concentration of a dopant of the second conductivity type therein.

21. The DMOS-transistor according to claim 20, wherein said first, second and third concentration values are all different from one another.

22. A method of producing the DMOS-transistor according to claim 1, said method comprising the steps:
   a) providing said semiconductor body;
   b) forming in said semiconductor body said trench bounded by said source-side wall, said drain-side wall, and said floor extending in said lateral direction between said bottom ends of said walls; and
   c) doping said semiconductor body to form said drift region including said doped source-side wall region along said source-side wall, said doped drain-side wall region along said drain-side wall, and doped floor region extending in said lateral direction along said floor;
   wherein said doping in said step c) to form said floor region includes at least a first dopant implantation directed through said trench into said floor after said step b), so as to implant said implanted dopant into only said first floor portion and not said second floor portion of said floor region and thereby produce said dopant concentration gradient in said lateral direction in said floor region.

23. The method according to claim 22, further comprising, before said first dopant implantation, providing a mask on said semiconductor body to cover said second floor portion and leave exposed said first floor portion of said floor region, and then carrying out said first dopant implantation while using said mask to spatially limit said first dopant implantation.

24. The method according to claim 23, further comprising, after said first dopant implantation, shifting an edge of said mask in said lateral direction to expose a third floor portion of said floor region that had been covered by said mask during said first dopant implantation, and then carrying out a second dopant implantation into said third floor portion of said floor region, so that said first, second and third floor portions of said floor region respectively have different dopant concentrations.

25. The method according to claim 23, wherein said providing of said mask is achieved in a self-adjusting mask process step.

26. The method according to claim 25, wherein said providing of said mask comprises forming said mask by a structural or shape transfer through lithography and etching steps.

27. The method according to claim 25, wherein said providing of said mask comprises forming a positive or a negative of said mask with a photoresist layer.

28. The method according to claim 23, further comprising, before said providing of said mask and before said forming of said trench, providing a hard mask with an opening that defines a location, shape and size of said trench, and then forming said trench by etching through said opening, and then providing said mask on said hard mask.

29. The method according to claim 22, further comprising performing a LOCOS oxidation in said trench after said steps b) and c).

30. The method according to claim 22, wherein said forming of said trench is carried out by performing an STI etching process, and further comprising filling said trench with an insulating material after said steps b) and c).

* * * * *

UNITED STATES PATENT AND TRADEMARK OFFICE
CERTIFICATE OF CORRECTION

PATENT NO. : 7,064,385 B2
APPLICATION NO. : 10/946547
DATED : June 20, 2006
INVENTOR(S) : Dudek et al.

It is certified that error appears in the above-identified patent and that said Letters Patent is hereby corrected as shown below:

Column 8,
Line 32, after "words", replace ";" by --,--;

Column 13,
Line 4, after "from", replace "one half" by --one-half--;

Column 14,
Line 4, after "and" insert --said--.

Signed and Sealed this

Ninth Day of January, 2007

JON W. DUDAS
*Director of the United States Patent and Trademark Office*